(12) United States Patent
Kim

(10) Patent No.: US 7,611,950 B2
(45) Date of Patent: Nov. 3, 2009

(54) METHOD FOR FORMING SHALLOW TRENCH ISOLATION IN SEMICONDUCTOR DEVICE

(75) Inventor: Jung Ho Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 286 days.

(21) Appl. No.: 11/319,618

(22) Filed: Dec. 29, 2005

(65) Prior Publication Data

US 2006/0141731 A1 Jun. 29, 2006

(30) Foreign Application Priority Data

Dec. 29, 2004 (KR) .................. 10-2004-0115783

(51) Int. Cl.
*H01L 21/336* (2006.01)
(52) U.S. Cl. .................. 438/296; 257/E21.545; 438/428; 438/359
(58) Field of Classification Search .................. 438/218, 438/248, 296, 359; 257/E21.545
See application file for complete search history.

(56) References Cited

U.S. PATENT DOCUMENTS

| 5,578,518 | A | * | 11/1996 | Koike et al. | .................. 438/424 |
| 6,368,941 | B1 | * | 4/2002 | Chen et al. | .................. 438/424 |
| 6,426,271 | B2 | * | 7/2002 | Chen et al. | .................. 438/435 |
| 6,589,854 | B2 | * | 7/2003 | Liu et al. | .................. 438/435 |
| 2005/1025029 | | * | 11/2005 | Jung | .................. 438/424 |

* cited by examiner

*Primary Examiner*—Asok K Sarkar
(74) *Attorney, Agent, or Firm*—Lowe Hauptman Ham & Berner, LLP

(57) ABSTRACT

A method for forming shallow trench isolation in a semiconductor device. The method includes forming a pad oxide and a pad nitride on a semiconductor substrate in successive order, forming a trench in the substrate by etching the pad nitride, the pad oxide and the substrate, removing a portion of the pad oxide to expose top corners of the trench, and rounding the exposed portion of the top corners of the trench by a wet chemical etch.

4 Claims, 3 Drawing Sheets

METHOD FOR FORMING SHALLOW TRENCH ISOLATION IN SEMICONDUCTOR DEVICE

This application claims the benefit of Korean Application No. 10-2004-0115783, filed on Dec. 29, 2004, which is incorporated by reference herein in its entirety.

BACKGROUND OF THE INVENTION

1. Field of the Invention

The present invention relates generally to a semiconductor device manufacturing technology, and particularly to a method for forming shallow trench isolation in a semiconductor device.

2. Description of the Related Art

Manufacturing processes for making highly integrated semiconductor devices involve forming a variety of components, such as a transistor, capacitor, metal wiring, etc., in very restricted regions, and forming highly insulated regions to prevent parasitic current leakage between the components.

Conventionally, a local oxidation of silicon (LOCOS) field oxide, formed by oxidizing a silicon substrate, has been widely used for isolating the components of the semiconductor device. However, due to the increase of the integration density, a LOCOS field oxide has become disadvantageous to the formation of integrated circuits, because it generally includes a "bird's beak," which may invade an active device region. Accordingly, a lot of alternative isolation technologies that are more advantageous to the higher integration of devices have been developed. As a typical example of such alternative isolation technologies, shallow trench isolation (STI) having a superior insulating performance and a relatively small formation area has been widely used for isolating transistors in higher integrated metal oxide semiconductor field effect transistor (MOSFET) and bipolar junction transistor devices.

In a typical STI process, a pad oxide and a pad nitride are firstly formed on an entire silicon substrate in successive order to protect an active device area. A photoresist layer is formed and patterned on the pad nitride by a photolithography process. The photoresist pattern defines an opening over an isolation area of the substrate.

After the exposure of the pad nitride by the photoresist pattern, the pad nitride and pad oxide are partially removed by an anisotropic etching process using the photoresist pattern as an etching mask. This etching process is performed to expose the isolation area in which a trench structure may be formed. Next, the photoresist pattern is removed, and the exposed isolation area of the substrate is then etched in a predetermined depth by an anisotropic etching process using the pad nitride as an etching mask. The isolation trench structure, formed by the aforementioned process, is illustrated in FIG. 1 that shows the silicon substrate indicated as 10, the trench indicated as 20, the etched pad oxide indicated as 22, and the etched pad nitride indicated as 24.

After the trench etch, a trench oxide is formed in the trench 20 and the entire substrate 10. The formation of the trench oxide generally involves a high-temperature heat treatment that may produce or result in damage to the silicon substrate. Accordingly, before the formation of the trench oxide, it is preferable to form a liner oxide on each trench sidewall. The liner oxide serves as a buffer for protecting the trench sidewall from any silicon lattice stress that may be caused by the trench oxide.

The trench oxide, e.g., a chemical vapor deposited (CVD) silicon oxide, is formed over the entire substrate 10, filling the trench 20. This trench oxide also covers the active device area, and it should be selectively removed for device processing to continue. This is accomplished by planarizing the substrate, typically via chemical-mechanical polishing (CMP), using the pad silicon nitride layer over the active device area as a stop layer. This process removes the trench oxide from the active device area while retaining it in the isolation trenches. The pad nitride 24 and pad oxide 22 are then removed, resulting in a highly planar substrate with isolated device areas.

FIG. 2 shows the isolation trench structure filled with the trench oxide. Here, reference numerals 10, 20a, and 30 indicate the silicon substrate, the trench oxide, and a gate oxide to be formed in a subsequent process, respectively.

Referring to FIG. 2, the silicon substrate has a sharp profile at the upper corner (A) of the trench, because the trench is formed by the anisotropic etching process. Consequently, when the gate oxide 30 is formed on the active device area to extend from the trench oxide, the silicon dioxide at the upper corner (A) is formed in the thickness $T_{20}$, which is much smaller than the thickness $T_{30}$ of the silicon dioxide at the active device area.

This oxide thinning at the upper corner of the trench may result in degradation of the threshold voltage of the transistor. In addition, the sharp profile of the substrate may induce the electric field concentration and silicon lattice stress at the upper corners of the trench. As a result, the performance of the transistor may be deteriorated.

SUMMARY OF THE INVENTION

It is, therefore, an object of the present invention to provide a method for improving the profile of the semiconductor substrate in the vicinity of top corners of the isolation trench. The electric field concentration and silicon lattice damage in the vicinity of top corners of the isolation trench can be effectively prevented. In addition, the present invention can prevent the oxide thinning at top corners of the isolation trench. Thus, the present invention can improve the performance of transistors, particularly high voltage transistors with thick gate oxide dimensions.

To achieve the above objects, an embodiment of a method for forming shallow trench isolation in a semiconductor device, according to the present invention, comprises the steps of: (a) forming a pad oxide and a pad nitride on a semiconductor substrate in successive order; (b) forming a trench in the substrate by etching the pad nitride, the pad oxide and the substrate; (c) removing a portion of the pad oxide to expose top corners of the trench; and (d) rounding the exposed portion of the top corners of the trench by a wet chemical etch.

Here, step (c) is preferably performed by a wet etch process using a hydrofluoric acid. Step (d) is preferably performed by a wet etch process using standard cleaning 1 (SC-1) solution. Especially, it is more preferable to use SC-1 solution at a temperature of from 60° C. to 85° C.

These and other aspects of the present invention will become evident by reference to the following description of the invention, often referring to the accompanying drawings.

DETAILED DESCRIPTION OF THE INVENTION

Figure 3:
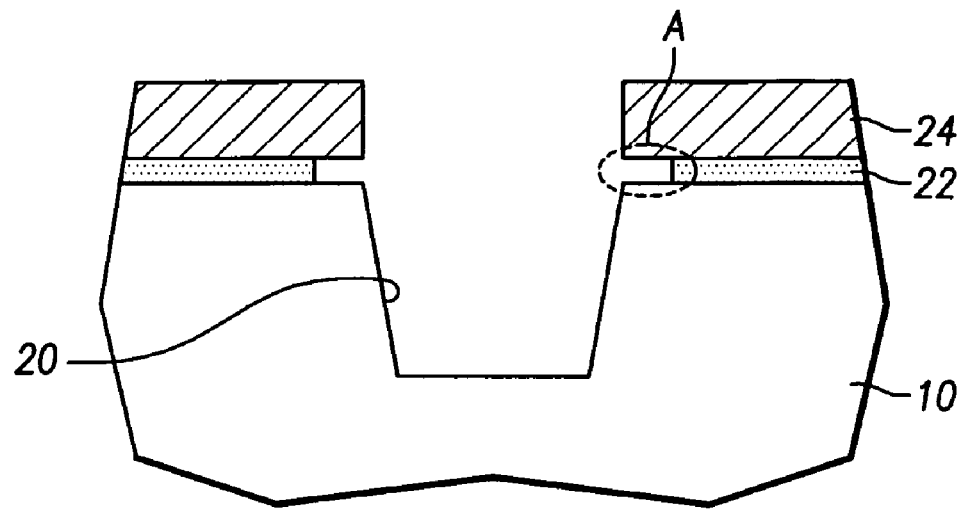
FIGS. 3 and 4 are cross-sectional views of an isolation trench structure, illustrating a method for rounding top corners of the isolation trench, according to the present invention.
Figure 4:
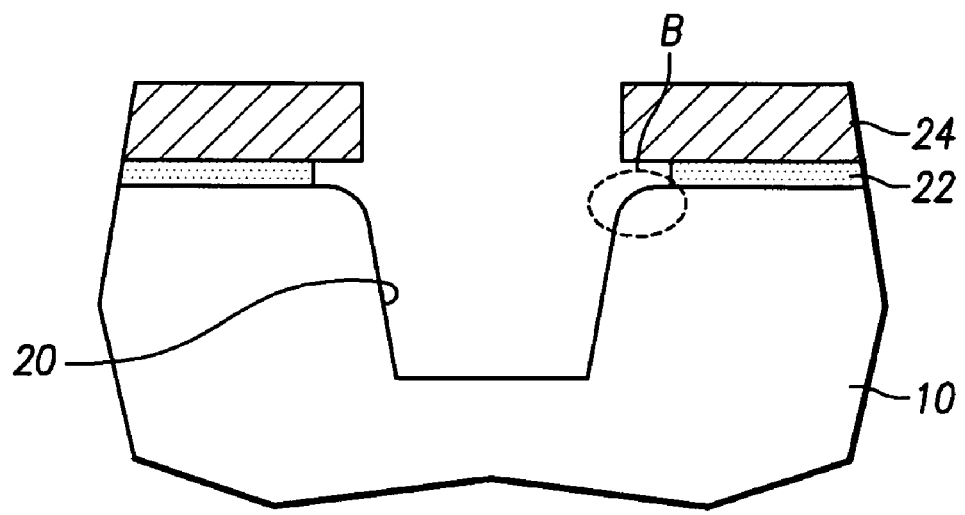

In FIGS. 3 and 4, the illustrated trench structure has a bird's beak shape at upper corners of the trench 20, which can be formed in such a manner as described hereinafter.

First, a pad oxide 22 and pad nitride 24 are formed on a silicon substrate 10 in successive order. Next, a photoresist pattern (now shown) is formed on the pad nitride 24 by a photolithography process. The photoresist pattern defines an opening over an isolation region in which a trench structure 20 is be formed. The opening exposes a portion of a top surface of the pad nitride 24 disposed over the isolation region.

After definition of the photoresist pattern, the portion of the pad nitride 24 exposed by the opening of the photoresist pattern is removed, exposing a portion of the pad oxide 22. The exposed portion of the pad oxide 22 is then removed, exposing a top surface of the substrate 10. Continuously, the exposed isolation region of the substrate 10 is etched in a predetermined depth, so that the trench 20 is formed. The trench etch is performed by a suitable etching process, preferably an anisotropic etching process such as a reactive ion etch (RIE). After the trench etch, the photoresist pattern on the pad nitride 24 is removed, and then the substrate 10 is rinsed in deionized water Next, a portion of the pad oxide 22, disposed between the pad nitride 24 and the substrate 10, is selectively removed. The selective removal of the pad oxide 22 can be performed by a wet etch that is selective to a silicon dioxide, using hydrofluoric acid (HF). As shown in FIG. 3, top corners (A) of the trench 20 are exposed after the selective removal the pad oxide 22.

As shown in FIG. 3, the top corners (A) of the trench 20 have sharp profiles, which are rounded to be curved surfaces by the following process. Namely, the region (A) of the top portions of the trench 20 is partially etched by a wet chemical etch using wet etchants, such as standard cleaning 1 (SC-1) solution, and the like. In particular, SC-1 solution includes water, hydrogen peroxide, and ammonium hydroxide, and can remove a little amount of silicon at the top corners of the trench 20, preserving the integrity of the pad oxide 22 and pad nitride 24. It is more effective to use the SC-1 at a temperature of from about 60° C. to 85° C. After the rounding process, the sharp profile of the top corners of the trench can be changed or rounded to be a curved surface (B), like a bird's beak as shown in FIG. 4.

Figure 1:
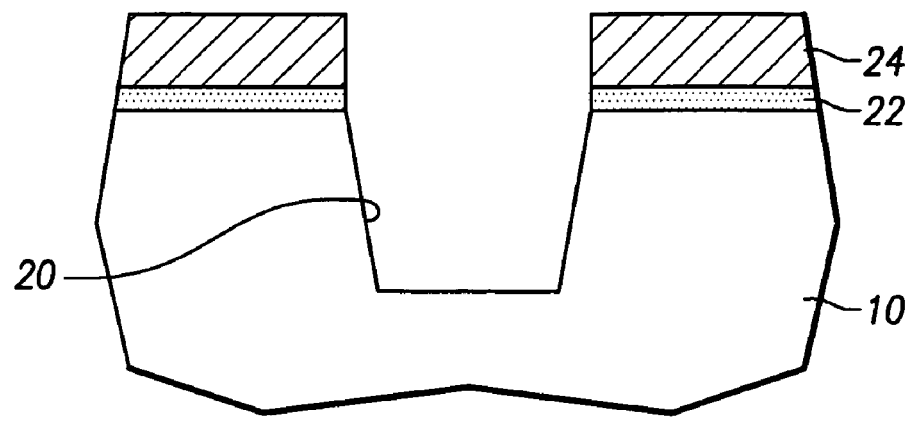
FIG. 1 is a cross-sectional view of an isolation trench structure, illustrating a conventional method for forming shallow trench isolation in a semiconductor device.
Figure 2:
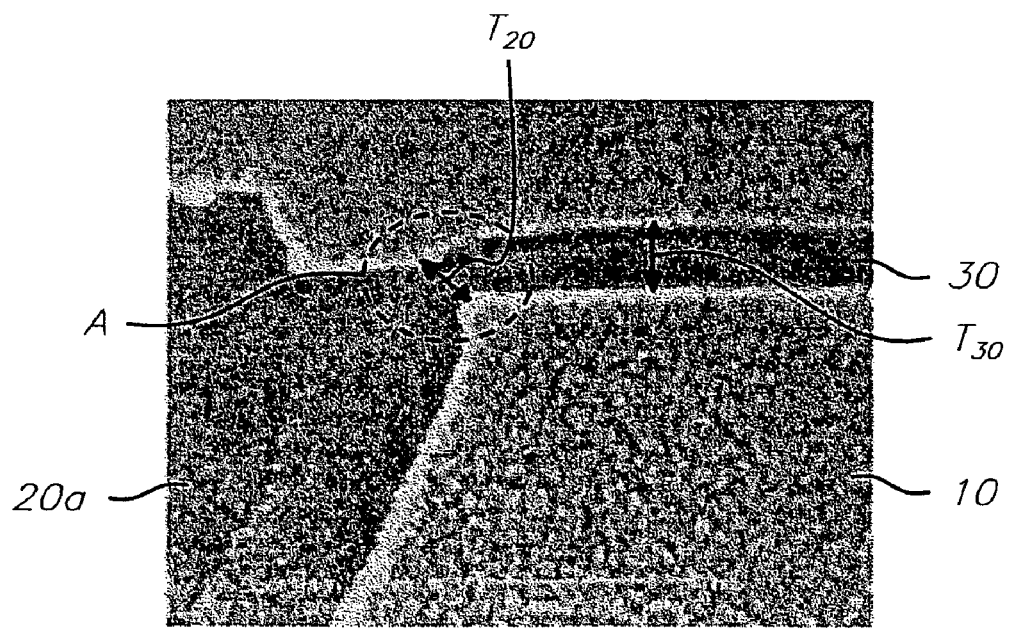
FIG. 2 is a scanning electron microscopy (SEM) image of the shallow isolation trench, illustrating the oxide-thinning problem that may occur in the conventional method.
Figure 5:
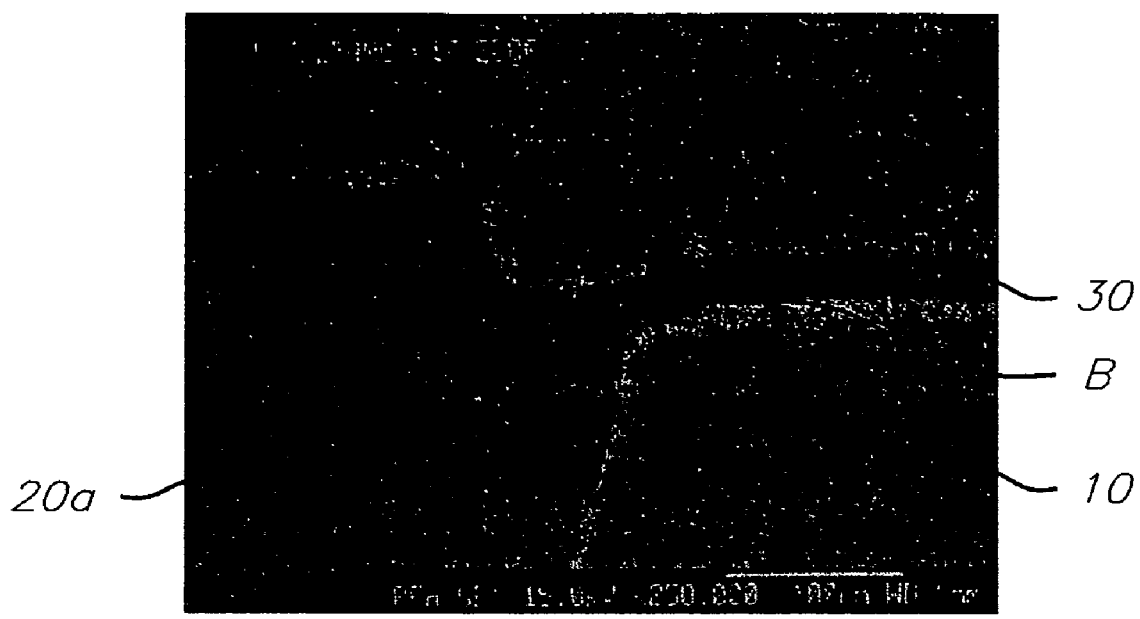
FIG. 5 is a SEM image of the semiconductor device in the vicinity of the top corners of the shallow trench isolation formed by the method according to the present invention.

Afterwards, the substrate can undergo processes for forming a liner oxide and a trench oxide filling the trench 20, planarizing the entire surface thereof, and particularly forming a gate oxide in the active device area where a transistor can be formed. FIG. 5 shows an upper portion of the STI structure including the silicon substrate 10, trench oxide 20a, and the gate oxide 30 extending from the trench oxide 20a. Referring to FIG. 5, the substrate 10 has a relatively smooth profile or gradient at the top corner of the trench, in comparison to the steep profile as shown in FIG. 2. Especially, the gate oxide in the region B, extending from the top corner of the trench, is formed in a uniform thickness, without the oxide thinning as shown in FIG. 2. Forming the gate oxide in a uniform thickness can effectively prevent a current leakage at the interface between the isolation region and the junction region, and further improve a threshold voltage of transistors, particularly high voltage transistors with thick gate oxide dimensions.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming shallow trench isolation in a semiconductor device, comprising the steps of:
   (a) forming a pad oxide and a pad nitride on a semiconductor substrate in successive order;
   (b) forming a photoresist pattern on the pad nitride by a photolithography process;
   (c) forming a trench in the substrate by etching the pad nitride, the pad oxide and the substrate using the photoresist pattern as an etching mask, and removing the photoresist pattern;
   (d) removing a portion of the pad oxide to expose top corners of the trench by selectively wet etching the pad oxide using the pad nitride as an etching mask; and
   (e) rounding the exposed portion of the top corners of the trench by a wet chemical etch process using standard cleaning 1 (SC-1) solution without an oxidizing process, wherein an entirety of a lateral edge of the pad nitride layer defined along the trench has a sharp profile.

2. The method of claim 1, wherein step (d) is performed by a wet etch process using hydrofluoric acid.

3. The method of claim 1, wherein the wet etch process using SC-1 solution is performed at a temperature of from 60° C. to 85° C.

4. The method of claim 1, wherein step (d) is performed without etching of the pad nitride layer.

* * * * *